United States Patent [19]

Yokoyama et al.

[11] Patent Number: 4,689,516
[45] Date of Patent: Aug. 25, 1987

[54] POSITION ADJUSTMENT DEVICE WITH A PIEZOELECTRIC ELEMENT AS A LOCK MECHANISM

[75] Inventors: Katsunori Yokoyama, Ebina; Chiaki Tanuma, Tokyo, both of Japan

[73] Assignee: Kabushiki Kaisha Toshiba, Kawasaki, Japan

[21] Appl. No.: 856,453

[22] Filed: Apr. 28, 1986

[30] Foreign Application Priority Data

May 2, 1985 [JP] Japan ................................. 60-95201
Feb. 14, 1986 [JP] Japan ................................. 61-30143

[51] Int. Cl.⁴ .......................................... H01L 41/08
[52] U.S. Cl. .................................... 310/317; 310/328
[58] Field of Search ................ 310/321, 323, 328, 317

[56] References Cited

U.S. PATENT DOCUMENTS

| 3,296,467 | 1/1967 | Locher | 310/328 X |
| 3,390,559 | 7/1968 | Steutzer | 310/323 |
| 4,219,755 | 8/1980 | O'Neill et al. | 310/328 |
| 4,342,935 | 8/1982 | Kallmeyer et al. | 310/328 |
| 4,382,243 | 5/1983 | Babitzka et al. | 310/328 X |
| 4,384,230 | 5/1983 | Wisner | 310/328 X |
| 4,408,832 | 10/1983 | Hartman et al. | 310/328 X |
| 4,438,363 | 3/1984 | Babitzka et al. | 310/328 |

FOREIGN PATENT DOCUMENTS 54-140874  11/1979  Japan .

Primary Examiner—Mark O. Budd
Attorney, Agent, or Firm—Oblon, Fisher, Spivak, McClelland & Maier

[57] ABSTRACT

A position adjustment device employs a holder on which a semiconductor wafer is attached. When placed on a surface plate, the wafer holder is turned upside-down, so that unlocked leg rods and the pattern transfer surface of the wafer are in direct contact with a reference surface of the plate. Piezoelectric elements are embedded in the holder as locking mechanism for the movable leg rods. In response to a variable DC voltage supplied by a voltage generating circuit, the piezoelectric elements deform to lock the rods with high accuracy.

7 Claims, 6 Drawing Figures

POSITION ADJUSTMENT DEVICE WITH A PIEZOELECTRIC ELEMENT AS A LOCK MECHANISM

BACKGROUND OF THE INVENTION

The present invention relates to a position adjustment device and, in particular, to a position adjustment device using a piezoelectric displacement device which deforms in response to an applied voltage to precisely adjust an object to a reference position.

Position alignment or adjustment devices have been used in various kinds of technical fields in order to precisely adjust the position of an object, such as a semiconductor wafer in an electron beam fine pattern exposure system, an optical coupling element in an optical communication system, etc. One such device is known which is used to adjust the position of a semiconductor wafer set in the pattern exposure apparatus in such a manner that the surface of the wafer coincides with the known reference surface of a sample table unit. This position alignment of the semiconductor wafer should be carried out with high accuracy. Otherwise, an image of the mask pattern will not be just-focussed onto the wafer, and it will be impossible to transfer the electron beam pattern onto the wafer precisely.

In a conventional pattern transfer apparatus using electron beam, a semiconductor wafer is position-adjusted manually by an operator and then fixed to the last determined position by using mechanical fixation means. More specifically, the semiconductor wafer, onto which the mask pattern is to be transferred, is placed within a wafer supporting member, known as "wafer cassette holder", and then put on a known table plate defining a reference surface. The wafer holder is arranged such that it can move up and down on the table to vary the height of the wafer surface with respect to the reference surface. The height of the wafer holder is adjusted to cause the wafer surface, onto which a beam pattern will be transferred, to be in precisely coincidence with the reference surface. The wafer holder is then locked mechanically, so that the wafer is held at the same level as the reference surface.

A plurality of rods are movably provided in the cylindrical holes cut in the wafer cassette holder. They can vertically move in the holes and serve as support legs for the wafer holder set on the table plate. When the rods project downward from the holes to push the table surface, the wafer holder may be lifted up on the table. The wafer holder may fall down when these rods are moved back and pulled into the holes. Therefore, by changing the distance the movable rods move from the holes, which corresponds to the leg length of the wafer, the wafer surface can be precisely aligned with the reference surface of the sample table.

After the position adjustment is completed, each rod should be rigidly clamped in the corresponding hole to hold the wafer cassette holder at the finally adjusted height. Screws are usually provided in the wafer holder for clamping the rods inside the holes. For such the clamping mechanism, it is very difficult to keep holding the wafer accurately at the last adjusted height while the screws are being rotated to compress and lock the leg rods. This is because the mechanical vibration caused by rotating the screws makes the surface of the wafer set in the cassette holder move from the justadjusted position as it is applied to the wafer cassette holder. Although the rods are being compressed by screws, the precise position adjustment cannot be achieved if the wafer holder is inclined or misaligned again with respect to the reference surface due to the mechanical vibration. An adjustment of the wafer position on the order of microns or, more precisely, of submicrons, is far from possible.

SUMMARY OF THE INVENTION

It is therefore an object of the present invention to provide a new and improved position adjusting technique which can electrically adjust the position of an object with a high accuracy.

In accordance with the above object, the present invention is addressed to a specific device which includes a mechanical support member for supporting an object and for adjusting the position of the object. A piezoelectric element is used as a clamping mechanism for locking or unlocking the support member. It deforms or distorts in accordance with an electric field generated in it in response to the application of a drive voltage.

The piezoelectric element is specially designed to lock or unlock the support member. When a certain drive voltage is applied to the piezoelectric element, the element contracts to unlock the support member and allows the member to move for adjusting the position of the object. When the application of the drive voltage is stopped, the element expands to its original size, clamping the support member. The support member is thus stably fixed or clamped in its last adjusted position, where it supports the object in a desired position. Since the support member is effectively locked or clamped by the expanded piezoelectric element under no bias condition, there is no need to continuously supply with the element any kind of drive voltage. Hence, the piezoelectric element can be disconnected from a voltage source circuit after the position adjustment is completed for the object.

The invention, and its objects and advantages, will become more apparent in the detailed description of a preferred embodiment presented below.

BRIEF DESCRIPTION OF THE DRAWINGS

In the detailed description of a preferred embodiment of the invention presented below, reference is made to the accompanying drawings in which.

DETAILED DESCRIPTION OF PREFERRED EMBODIMENTS

Figure 1:
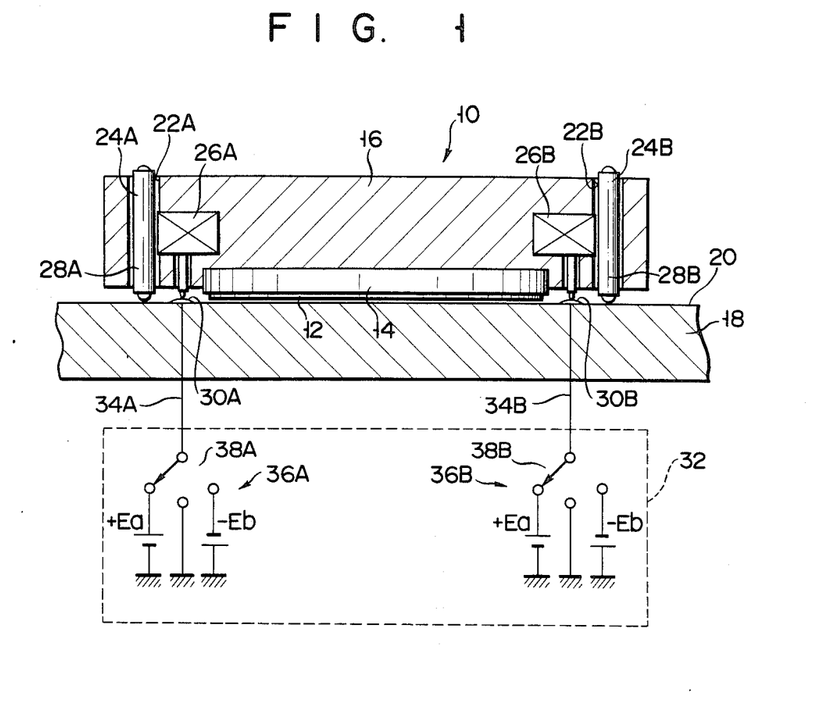
FIG. 1 shows a sectional view of a semiconductor wafer cassette holder put on a reference surface plate and a voltage generating circuit connected thereto in accordance with one preferred embodiment of the invention.

There is shown in FIG. 1 of the drawings a wafer alignment device, designated generally by the numeral 10. This wafer alignment device 10 is used for a known electron beam pattern exposure system (not shown in FIG. 1), wherein a mask pattern is transferred onto a semiconductor wafer by using electron beam. A typical arrangement of such the electron beam pattern exposure system is known among skilled persons and is described in U.S. Pat. No. 4,558,225 to GOTOU et al., for example. In this system, it is required that the position of the semiconductor wafer be precisely adjusted to a reference position and, at the same time, the wafer surface is kept identical with the reference surface onto which an electron beam pattern is just focused. The use of the wafer alignment device 10 enables the position adjustment of the semiconductor wafer to be more precise and accurate, without degrading the positioning speed.

Semiconductor wafer 12 onto which a mask pattern is to be transferred is comprised of a signal-crystalline silicon plate having a thin-disk shape. This wafer 12 is electrostatically attached by known means to a substrate 14, which is loaded in a square box-shaped cassette holder 16 made of metal. Wafer 12 is thus fixedly mounted on the lower surface of wafer holder 16.

To carry out the position adjustment of wafer 12, first of all, wafer holder 16 is put on a known surface plate 18 having its upper surface which defines a reference surface 20. Holder 16 is placed on the reference surface plate 18 such that a surface of wafer 12, onto which a beam pattern is to be transferred, is full area-to-area contact with the reference surface 20 as shown in FIG. 1.

Holder 16 has a plurality of vertically-extended cylindrical openings 22. In this embodiment, four cylindrical openings are formed in wafer holder 16 at four corners thereof, although only two openings 22A and 22B are illustrated in cross-sectional view of FIG. 1. Four metal rods 24A, 24B, . . . are movably provided respectively in cylindrical openings 22A, 22B, . . . In the following description, suffixes A and B may be dropped, if there is no need to particularly distinguish between them. Each rod 24 is so arranged as to be freely movable in the corresponding cylindrical opening 22 along a direction perpendicular to the reference surface 20. When being mounted on surface plate 18, holder 16 may be also supported by four rods 24 on reference surface 20, if these rods are fixed by clamping mechanism in cylindrical openings 22. Each metal rod 24 has distal ends of half-ball shape as shown in FIG. 1. Rods 24 serve as support legs for the main body of wafer holder 16. Rods 24 can be in point-contact with reference surface 20. It is thus possible to facilitate well-stabilized positioning of holder 16 on reference surface 20 of plate 18.

Piezoelectric elements 26A, 26B, . . . are embedded as the clamping mechanism in wafer holder 16 at the corresponding positions to cylindrical openings 22A, 22B, . . . As four leg rods 24 are provided for holder 16, the same number of, four, piezoelectric elements 26 are necessary to clamp leg rods 24 independently. Piezoelectric elements 26 are housed in the corresponding room spaces, which are formed in holder 16 so as to be coupled with the middle portions of cylindrical openings 22, respectively. The room spaces are extended horizontally to be coupled with the vertical cylindrical openings 22 at their ends. Each cylindrical opening 22 and the corresponding room space forms inside holder 16 an opening of T-shaped cross section as shown in FIG. 1.

Each piezoelectric elements 26 is mechanically deformed or distorted along its longitudinal direction in accordance with a voltage applied thereto. When piezoelectric elements 26 is longitudinally expanded toward the cylindrical opening 22 and its free end presses the round side wall of the corresponding leg rod 24, the movement of rod 24 in opening 22 is extremely restricted due to the mechanical contact force (i.e., clamping pressure) generated between the leg rod and the piezoelectric element. When the piezoelectric element 26 is further expanded in response to increase in the applied voltage, the reciprocal movement of leg rod 24 in opening 22 is no longer permitted, so that the rod is fixed to the last adjusted position in the opening. In this sense, piezoelectric elements 26 serve as a locking mechanism for slidable rods 24 in openings 22 of wafer holder 16.

When wafer holder 16 is placed on surface plate 18, leg rods 24 are unloosed so that the lower surface of wafer 14 and the rounded low ends of pins 22 are indirect contact with the reference surface 20. Under this condition, the wafer surface onto which an electron beam pattern is to be transferred precisely coincides with the reference surface 20. If all the rod pins 22 are locked by the corresponding piezoelectric elements 26, the low ends of rods 24 and the patterning surface of wafer 12 are kept identical with each other, even after wafer holder 16 is removed from surface plate 18.

Wafer holder 16 is provided with connect pins 28A, 28B, . . . which are electrically connected to piezoelectric elements 26A, 26B, . . . , respectively. These connect pins 28 are expandable, by the elastic force of springs (not shown) provided therein, vertically with respect to the lower surface of wafer holder 16. When wafer holder 16 is placed on surface plate 18, contact pins 28A, 28B, . . . project downward to be in contact with metal pads 30A, 30B, . . . , which are formed on the reference surface 20 of surface plate 18. As a result, piezoelectric elements 26 are electrically connected with the corresponding contact pads 30, while wafer holder 16 is placed on plate 18.

A voltage generating circuitry 32 is connected to contact metal pads 30 formed on surface plate 18. Voltage generator 32 is thus connected with piezoelectric elements 26 housed in wafer holder 16, which is placed on surface plate 18. Under this condition, voltage generator 32 supplies a variable DC voltage which causes electric fields of different intensities to be formed in piezoelectric elements 26, respectively.

Voltage generator 32 includes independent DC voltage source units 34A, 34B, . . . which feed the corresponding piezoelectric elements 26A, 26B, . . . embedded in wafer holder 16. In this embodiment, although only two voltage source units 36A, 36B are illustrated in FIG. 1, four voltage source units are actually included in the voltage generator 32, since four piezoelectric elements are provided in wafer holder 16. Voltage source unit 32A is electrically connected with piezoelectric element 28A, and unit 32B with element 28B.

Voltage source unit 36A includes a switch 38A which has a common terminal connected to piezoelectric element 26A through lead wire 34A. Switch 36A has three voltage input terminals. The first voltage input terminal is connected to a battery generating a positive polarity of DC voltage +Ea, the second terminal grounded, and the third terminal a battery generating a negative polarity of DC voltage −Eb. Voltage source unit 36B is connected with piezoelectric element 26B through a lead wire 34B and includes a switch 38B which has the same configuration as that in voltage source unit 36A, so that the detailed description thereof will be omitted by using the same reference numerals with the corresponding suffix B.

Figure 2:
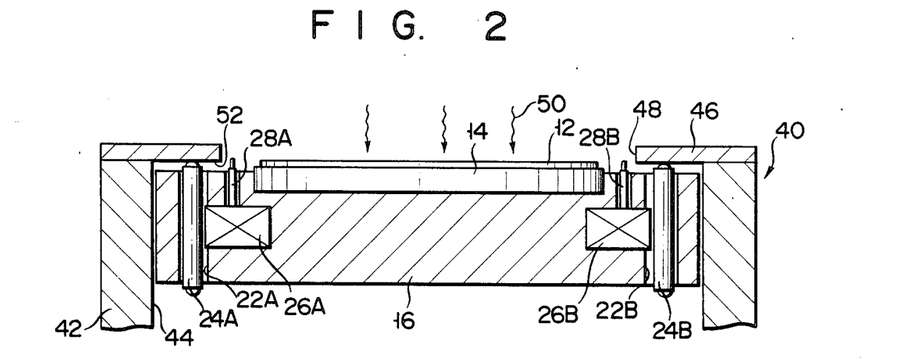
FIG. 2 is a sectional view of the wafer cassette holder of FIG. 1, which is turned upside-down to be set in a table structure provided in an electron beam pattern exposure system.

FIG. 2 shows wafer holder 16 which is set in a sample support unit 40 provided in an electron beam pattern exposure apparatus, after the position adjustment of rods 24 is completed. When set in sample support unit 40, wafer holder 16 is turned upside-down to cause the pattern transfer surface of semiconductor wafer 12 is held upward in the electron beam pattern exposure apparatus. Support unit 40 has a square-shaped frame 42 for housing wafer holder 16 therein. Frame 42 defines a vertical guide wall 44 with which the side surface of wafer holder 16 is in contact as shown in FIG. 2. A horizontal table plate 46 is formed on the upper end of frame 42 to cover the upper opening thereof. Table plate 46 has an opening 48 through which an electron beam pattern 50 is radiated onto the pattern transfer surface, i.e., the top surface of semiconductor wafer 12. Table plate 46 defines at its lower surface a reference surface 52 for just-focussing the beam pattern. As the lower ends of leg rods 24 and the pattern transfer surface of wafer 12 are in coincidence with each other after the position adjustment is completed on surface plate 18 of FIG. 1, when the same ends of leg rods 24 now locked by piezoelectric elements 26 are placed on table plate 46, the exposed pattern transfer surface of wafer 12 housed in the upset wafer holder 16 should also be aligned with reference surface 52 of sample support unit 40.

Figure 3:
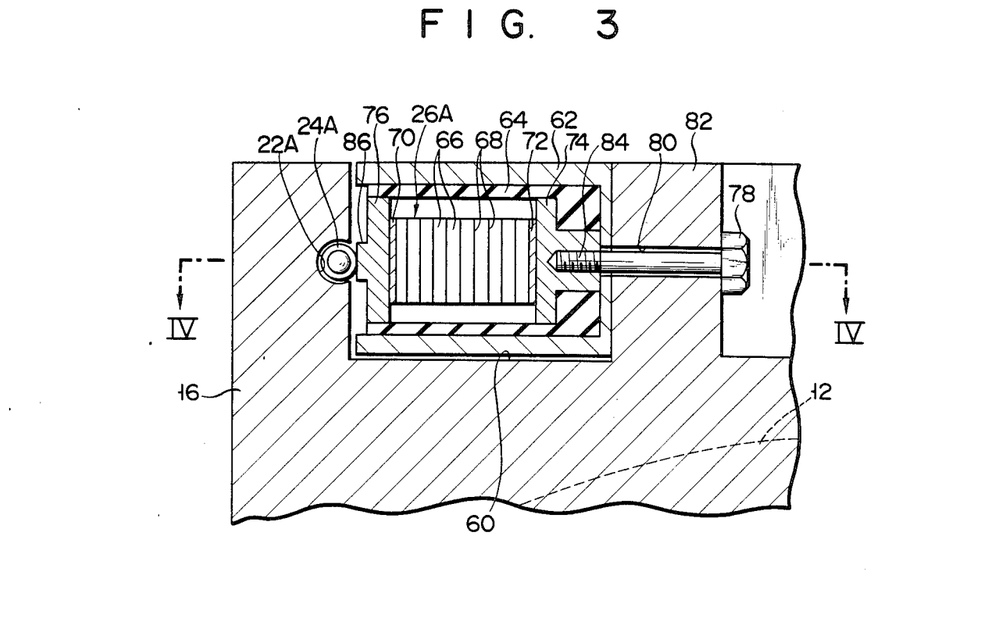
FIG. 3 shows in plan an expanded sectional view of a piezoelectric displacement element, which is embedded in the wafer holder of FIG. 1 to serve as a lock mechanism for a metal rod movably provided in a hole of the wafer holder.

Referring now to FIG. 3, this enlargedly shows one corner of wafer holder 16 in which one piezoelectric element 26A is provided. FIG. 3 is a plan view partially showing wafer holder 16, so that leg rod 24A, which is used to adjust the height of holder 16 with respect to the reference surface, is illustrated as a circle.

In a rectangular room space 60 of holder 16 is disposed a metal case unit 62 which is formed almost like a rectangular box whose one end opposing leg rod 24A is opened. An inner housing 64 is tightly placed in metal case unit 42. Inner housing 64 is made hollow so that it can hold therein piezoelectric element 26A. Inner housing 64 is made of insulative material so as to electrically separate piezoelectric element 26A from metal case unit 62.

Piezoelectric element 26A is comprised of a multilayered piezoelectric ceramic device having a plurality of thin piezoelectric disc plates 66 disposed one above another as shown in FIG. 3, so that piezoelectric element 26A looks like a solid cylinder as a whole. These piezoelectric disc plates 66 are polarized in the direction of plate thickness, and are stacked in such a manner that the polarization direction of two adjacent piezoelectric plates are reversed in relation to each other. Wiring electrode layers 68 are sandwiched between piezoelectric disc plates 66. Insulative plates 70 and 72 are attached to the both ends of cylindrical piezoelectric element 26A, which is sandwiched between metal fixtures 74 and 76 in metal case 62 housed in room space 60 of wafer holder 16.

One metal fixture 74, to which piezoelectric element 26A is adhered at its bottom, is placed at the bottom portion of insulative inner housing 64. Metal fixture 74 is locked by a screw 78, which penetrates through a hole 80 formed in a frame wall 82 of wafer holder 16 to be mechanically coupled with a negative screw 84 formed in metal fixture 74. The other metal fixture 76 is adhered to electrode layer 70 at the top portion of piezoelectric element 26A. Metal fixture 76 is positioned to cover the open end of insulative inner housing 64 as if it were a lid for a vessel. Lid-shaped metal fixture 76 is formed such that its peripheral edge is just fitted with the inner wall of housing 64 and that it is movable inside this housing 64. When piezoelectric element 26A is physically deformed along its longitudinal direction in response to an applied voltage, lid-shaped metal fixture 76 may reciprocate in accordance with the linear expansion or shrinkage of piezoelectric element 26A. A cylindrical projection 86 is formed on metal fixture 76 at the center thereof in such a manner that this projection 86 is in direct contact with the side wall of leg rod 24A movably put in vertical opening 22A of wafer holder 16. Therefore, when piezoelectric element 26A is expanded, rod 24A will be fixed due to direct compression pressure of cylindrical projection 86 of lid-shaped metal fixture 76.

Figure 4:
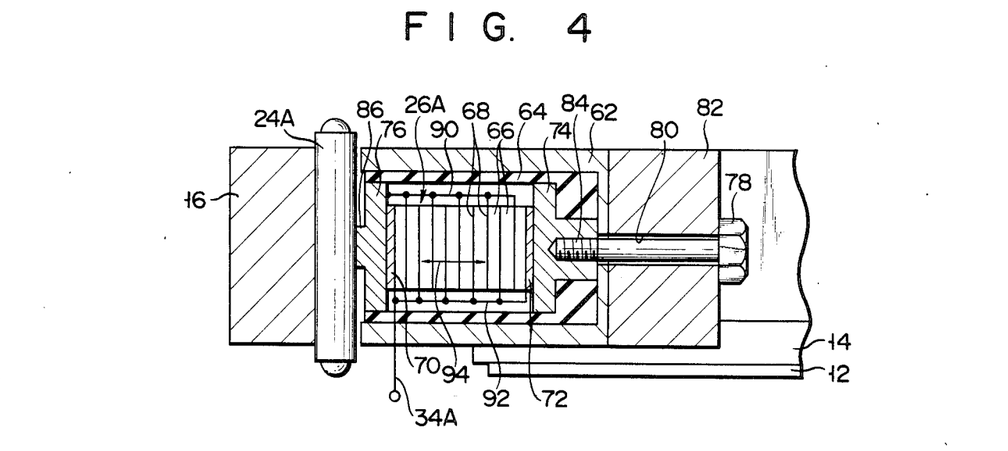
FIG. 4 shows an enlarged cross section of the piezoelectric displacement element of FIG. 3 along line IV—IV.

Wiring electrode layers 68 are connected in common to a first lead wire 90 at every other electrode layers as illustrated in FIG. 4. The remaining layers of wiring electrode layers 68 are connected in common with a second lead wire 92. First lead wire 90 is electrically connected to lid-shaped metal fixture 76, while second lead wire 92 is connected with voltage source line 34A to which a variable DC voltage is supplied by voltage generator 32 shown in FIG. 1.

Lid-shaped metal fixture 76 is electrically conducted with metal holder 16 by the way of position determining leg rod 24A whose round side wall is in contact with the inner surface of opening 22A of wafer holder 16. Therefore, when a DC voltage is applied by voltage generator 32 (FIG. 1) between line 34A and holder 16, the DC voltage is also applied between first and second lead wires 90 and 92 of piezoelectric element 26A embedded in wafer holder 16. In response to the voltage application, piezoelectric element 26A extends or contracts (expands or shrink) in its longitudinal direction shown by an arrow 94 in FIG. 4, thus generating displacement. The amount of displacement Dm of Piezoelectric element 26A may be represented by the following equation:

$$Dm = d \times n$$

where,
d: displacement at each piezoelectric plate 66,
n: the number of stacked piezoelectric plates 66.

Due to this displacement Dm, lid-shaped metal fixture 76 slides in insulative inner housing 64, by a distance corresponding to the actual displacement of piezoelectric element 26A, to press rod 24A, since piezoelectric element 26A is rigidly adhered to the other metal fixture 74 at its bottom portion. It is apparent that the clamping pressure of lid-shaped metal fixture 76 is varied in accordance with change in potential level of the applied DC voltage. When piezoelectric element 26A physically shrink, lid-shaped metal fixture 76 is moved inward to unloose leg rod 24A, which is then allowed to freely reciprocate in vertical opening 22A formed in wafer holder 16.

The operation mode of the aforementioned embodiment will now be described in greater detail with reference to FIG. 5, which shows a hysteresis characteristic of the piezoelectric element used as the lock mechanism.

Figure 5:
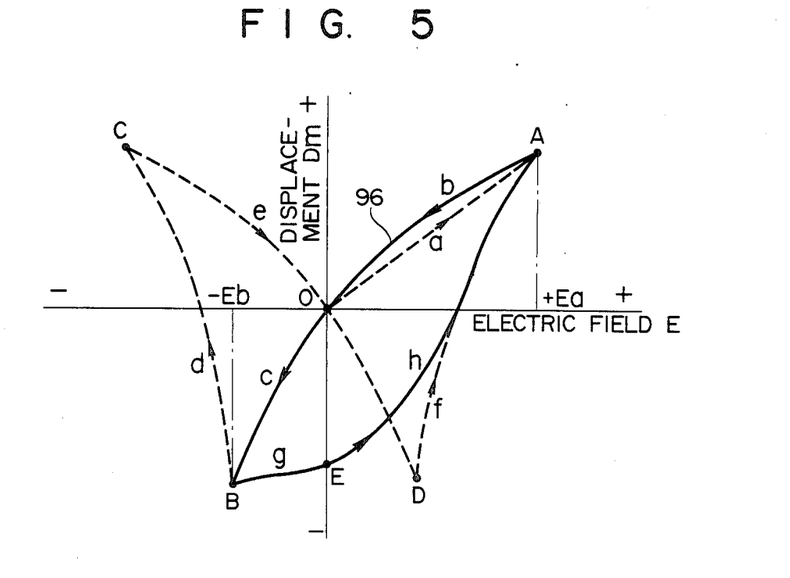
FIG. 5 is a diagram showing a hysteresis characteristic curve of the piezoelectric element, in which the amount of displacement is plotted as a function of electric field formed, within the piezoelectric element.

According to the graph of FIG. 5, the changes in the amount of displacement Dm of piezoelectric element 26 when voltage E is applied thereto are known as "butterfly characteristics" to one skilled in the art, since the shape of the characteristic curve resembles a butterfly with its wings open. In the graph of FIG. 5, the voltage point of a supply voltage from DC voltage source +Ea of voltage generator 32 shown in FIG. 1 is plotted as "+Ea". Similarly, the supply voltage from DC voltage source −Eb is plotted as "−Eb".

In an initial state, when voltage E applied to element 26 is 0, amount of displacement Dm is 0. As the voltage applied to element 26 is gradually increased in the positive direction (i.e., in the same direction as the polarization direction), displacement of element 26 increases linearly, as indicated by broken line "a" in FIG. 5. When positive voltage +Ea is applied to element 26 and the voltage applied to element 26 is decreased to 0 thereafter, amount of displacement Dm changes as indicated by curve "b". Subsequently, a negative voltage (having a maximum negative voltage level larger than −Eb), which increases gradually in a negative direction (i.e., a direction opposite to the polarization direction), is applied to element 26, the voltage is decreased to 0, and a positive voltage is again applied. In this case, amount of displacement Dm of element 26 varies as indicated by broken lines "c", "d", "e", and "f". Inflection point B between curves "c" and "d" corresponds to the voltage supplied from DC voltage source −Eb of voltage generator 32. Note that negative voltage −Eb used herein defines an electric field (coercive electric field) in which the polarization direction in element 26 is inverted. When the voltage applied to element 26 changes alternately between the positive and negative polarities, amount of displacement Dm occurring in element 26 has butterfly characteristics. The hysteresis characteristics themselves are generally known.

When wafer holder 16 is placed upside down on surface plate 18, as shown in FIG. 1, leg rods 24 are unlocked and the pattern transfer surface of semiconductor wafer 12 contacts reference surface 20 of plate 12. When rods 24 are locked under this condition, the rounded lower ends of rods 24 coincide precisely with the pattern transfer surface of wafer 12. According to the present invention, a voltage varying between two voltage levels +Ea and −Eb is applied to element 26, and the hysteresis curve of displacement Dm occurring in element 26 is that indicated by solid curve 96 in FIG. 5. When the applied voltage is increased/decreased between the two specific voltages described above, amount of displacement Dm of element 26 changes along different curves in accordance with the increase or decrease in the electric field (see line 96 in FIG. 5). In this embodiment, it is important to set the hysteresis characteristics as those of element 26, and to lock rods 24.

Piezoelectric element 26 of wafer holder 16 placed on surface plate 18 is connected to voltage generator 32 by lead wire 34 through a detachable electrical connection constituted by connect pin 28 and metal pad pattern 30, as previously described. When switches 38 of generator 32 are switched (to the first state of FIG. 1) to connect DC batteries +Ea to elements 26A, 26B . . . , positive voltage +Ea is supplied to each element 26. When switches 38 are switched to the second state, elements 26A, 26B, . . . are grounded. When switches 38 are switched to the third state, elements 26A, 26B, . . . are connected to DC batteries −Eb for generating a negative voltage for defining a polarization inversion electric field (coercive electric field) of element 26.

Assume that negative voltage −Eb, which defines a polarization inversion electric field (coercive electric field) of element 26, is applied to elements 26A, 26B, . . . Then, element 26 is physically contracted, and amount of displacement Dm thereof varies along curve "c" of FIG. 5 and reaches a point indicated by "B" therein. In this state, leg rods 24 are unlocked or loosened, so as to move freely in openings 22 of holder 16. Therefore, rods 24 contact reference surface 20 of plate 18 at their distal ends through their own weight, as shown in FIG. 1.

Subsequently, switches 38 of generator 32 are switched to the second state to cause elements 26A, 26B, . . . to be grounded. Amount of displacement Dm of element 26 to which no voltage is applied changes along curve "g", connecting points B and E in FIG. 5, and reaches point E. In this state, a displacement corresponding to point E remains in element 26 despite the fact that the applied voltage is 0.

Switches 38 are then switched to the first state to supply positive voltage +Ea to element 26. Element 26 is then elongated longitudinally, and its amount of displacement Dm varies along curve "h", connecting points E and A, and reaches point A. When switches 38 are switched to the second state again element 26 is set at ground voltage so that amount of displacement Dm of element 26 varies along curve "b", to return to the initial state, i.e., a 0 displacement state. The displacement of element 26 under the non-bias state is theoretically 0. However, in practice, element 26 is considered to be elongated when compared with the case wherein negative voltage −Eb defining the polarization inversion electric field (coercive electric field) is applied. In the present invention, a gap (called "initial gap") between the free end of element 26 and the side wall of the corresponding leg rod is designed such that element 26 can lock rods 24.

More specifically, the initial gap between the distal end of projection 86 of lid-like fixture 76, bonded to element 26 and the side wall of rod 24 shown in FIG. 4, is designed to be smaller than the displacement indicated by point E in FIG. 5. In the above embodiment, the practical initial gap between element 26 and the rod was selected to be, e.g., as small as about half to one third the displacement indicated by point E in FIG. 5 in order to completely clamp the rod with element 26 in the non-bias state. In this case, it is preferable that element 26 has a Young's modulus as large as possible and a high Curie temperature, and that amount of displacement Dm is as large as possible (e.g., element 26 is an integrally molded multi-layered piezoelectric ceramic element). When such element 26 was actually used and leg rods 24 were locked after completion of position alignment of wafer 12 on surface plate 18, they were locked with a sufficiently large clamping pressure, thus allowing no loosening. Thereafter, when wafer holder 16 was picked up from surface plate 18 and housed in an electronic beam pattern exposure system, wafer 12 was actually positioned with high precision, and no positioning error with respect to a reference surface of the system occurred.

An experiment conducted by the present inventors will now be described. Baked silver electrodes were formed on two surfaces of a thin piezoelectric ceramic disc plate having a diameter of 6 mm and a thickness of 0.5 mm. 25 disc plates, each prepared in this manner, were stacked to obtain piezoelectric displacement element 26. When a voltage of $-400$ V as an electric field corresponding to $-Eb$ was applied to element 26, element 26 contracted by 15 $\mu$m. When a voltage of 900 V as an electric field corresponding to $+Ea$ was applied to element 26, element 26 was elongated by 14 $\mu$m. The initial gap between leg rod 24 and projection 86 of metal fixture 76 was set to 10 $\mu$m, and the displacement amount of 5 $\mu$m was used to generate a clamping pressure to lock leg rod 24 to wafer holder 16. With this structure, it was confirmed that holder 16 was not moved downward against a load weight of up to 2 kg, and a sufficient locking force was obtained.

According to the position adjustment device of the present invention, rods 24 are fixed in openings 22 using a piezoelectric element having amount of displacement Dm which varies in accordance with a bias voltage. The clamping pressure for fixing rods 24 is constant so that they can be locked by a uniform force. Rods 24 are locked by element 26 in a non-bias state, i.e., in a state where no voltage is externally supplied. Therefore, rods 24 can be fixed effectively without being influenced by ambient conditions (e.g., a change in ambient temperature). This is because when element 26 is clamped in the non-bias state (static state), the amount of displacement thereof is highly stable, unlike clamping in a bias voltage-applied state (dynamic state), and the clamping pressure applied to rods 24 is little influenced by changes in ambient temperature.

A second embodiment of this invention will now be described with reference to FIG. 6, which shows a position adjustment device for an optical coupling unit used in a optical communication system.

A base table 100, called "stem", is provided with a vertical opening 102 in which a holder 104 is inserted movably. Holder 104 rigidly supports at its top portion an optical signal transmission cable 106, such as an optical fiber. More specifically, holder 104 consists of a head portion 104a and a straight leg portion 104b which is inserted into opening 102. A V-shaped groove 108 is formed in the top surface of holder head portion 104a. Optical fiber cable 106 is fixed in the V-shaped groove 108 by a known adhesion means 110, such as a solder, adhesive material, etc. Cable 106 is thus placed to extend in parallel with the top surface of base table 100 and optically connected at one distal end thereof with a known light emitting element (not shown), which generates an optical signal representing a digital signal to be transmitted in a known manner. Optical fiber cable 106 radiates an optical signal, which is transmitted therethrough from light emitting element, at the other distal end thereof. This cable end, designated by numeral "112" in FIG. 6, is immovable with respect to the movable cable holder 104. However, the height of the cable end 112 may be changed with respect to base table 100, since cable holder 104 can be movable upward or downward in vertical opening 102 of base table 100.

On base table 100 is also provided a support block 114 on which a photodetector 116 is fixed as a light signal receiving element. Photodetector 116 may be a known photodiode, for example. Support block 114 is fixedly mounted on table 100, so that photodetector 116 is inmovably positioned over base table 100. It should be required that optical fiber cable 106 and photodetector 116 are optically connected with each other in such a manner that cable 106 is linearly aligned with photodetector 116 to form an optical signal transmission path. Therefore, it is important that the positions of cable end 112 and photodiode 116 are carefully positionadjusted in a manner as to be in coincidence with each other along both the horizontal direction and the vertical direction of base table 100, in order to enable the maximally efficient communication of optical data signal. The positional relationship between support block 114, mounted on table 100, and vertical opening 102, formed in table 100, is thus accurately determined such that the horizontal positions of these elements are identical with each other. The only remaining position adjustment required to realize an effective data transmission is that the height of cable distal end 112 is varied with respect to the upper surface of base table 100 to cause cable end 112 to be aligned with photodetector 116 in a center line of optical fiber tube of signal transmission cable 106.

A piezoelectric element 120 is embedded in base table 100 as a clamping mechanism for vertically movable cable holder 104. Piezoelectric element 120 is placed within a room space 122 together with an insulative inner housing 124 and metal fixture plates 126 and 128. Room space 122 is so formed in table 100 as to be coupled with the middle portion of vertical opening 102. Room space 122 is extended horizontally and coupled with vertical opening 103 at its end. Vertical opening 102 in which cable holder 104 is placed and room space 122 forms inside table 100 an opening of T-shaped cross section as shown in FIG. 6.

Figure 6:
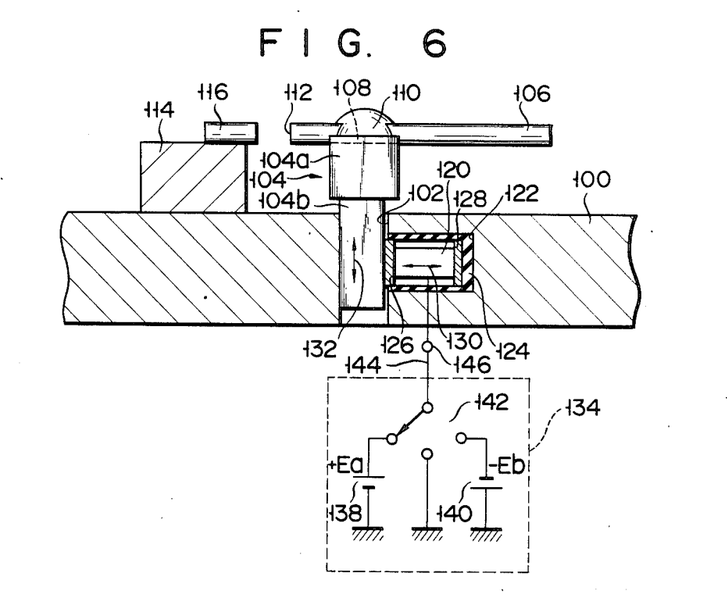
FIG. 6 shows a sectional view of a position adjustment device and a voltage generating circuit provided therefor, which is utilized for an optical coupling unit containing a optical signal transmission cable and a photodetector, in accordance with a second embodiment of the invention.

Piezoelectric element 120 is placed in insulative housing 122 and two metal plates 126 and 128 are attached to the top and bottom portions of piezoelectric element 120, respectively, as clearly shown in FIG. 6. Piezoelectric element 120 may be a multi-layered piezoelectric ceramic device, which is same as that used in the first embodiment shown in FIG. 1. Piezoelectric element 120 is deformed or distorted along its longitudinal direction 130 in accordance with a voltage applied thereto. When piezoelectric element 120 is expanded longitudinally toward the opening 102 and its free end presses the side wall of cable holder 104, the movement of holder 104 inside opening 102 is extremely restricted due to the clamping pressure of piezoelectric element 120. When piezoelectric element 120 is further expanded, the reciprocal movement of cable holder 104 is no longer permitted, so that holder 104 is fixed to the last adjusted position in opening 102 of base table 100. Therefore, piezoelectric element 120 can serve as a locking mechanism for cable holder 104.

When the position adjustment is carried out for optical fiber cable 106, cable holder 104 is unlocked so that the height of holder 104 with respect to the top table surface can be manually adjusted by an operator by moving cable holder 104 along the vertical direction, designated by an allow 132. After the position adjustment is completed, cable holder 104 is locked by piezoelectric element 126, so that the cable end 112 can be positioned to be aligned with photodetector 116 fixed on block 114.

A voltage generating circuitry 134 is connected to piezoelectric element for supplying a variable DC voltage which causes an electric filed of different intensities to be formed in piezoelectric element 120. Voltage generator 30 includes a DC voltage source unit 136 including two DC voltage sources 138 and 140, and a switch 138 which switches to selectively supply piezoelectric element 120 with DC voltages +Ea or −Eb generated by the voltage sources, or ground potential. It should be noted that voltage generator 134 is connected to piezoelectric element 120 through a lead wire 144. Voltage generator 134 is disconnectable from piezoelectric element 120 embedded in table 100, since lead wire 144 is connected with piezoelectric element 120 through a known type of electrical connector 146.

In the second embodiment shown in FIG. 6, while cable 106 and photodetector 116 are aligned by vertically moving cable holder 104, negative voltage −Eb (see FIG. 5) is applied to piezoelectric element 120 from voltage generator 134, in the same manner as in the above embodiment. Element 120 contracts in response to voltage -Eb so that holder 104 is unloosened, so as to be vertically movable in opening 102. When cable 106 is aligned with photodetector 116 upon vertical movement of holder 104 supporting cable 106, generator 134 alternately applies the ground voltage and positive voltage Ea to element 120, and stops application thereof. In this non-bias state, the initial gap between the free end of element 120 and the side wall of leg portion 104b of cable holder 104 is set carefully so that element 120 can lock holder 104. Therefore, even after the position alignment between cable 106 and photodetector 116 is completed and generator 134 is disconnected from table plate 100, holder 104 can be kept locked by element 120, stably and effectively.

Although the invention has been described with reference to specific embodiments, it shall be understood by those skilled in the art that numerous modifications may be made that are within the spirit and scope of the inventive contribution.

For example, the principal idea of use of piezoelectric element as a clamping mechanism for an object supporting member, which is the core concept of this invention, may be also applied to a video headmounting drum in which magnetic heads are to be precisely position-adjusted to unable the accurate tracing of field tracks formed on a running magnetic tape of a known helical-scan type video tape recorder. In this case, each magnetic video head is mounted on a head holder which is movably provided on a rotatable drum.

Piezoelectric elements are embedded in the drum to control the movement of head holders in such a manner as to carry out the accurate position-adjustment of each magnetic head, independently. In this case, a negative polarity of DC voltage is applied by a voltage source circuit to the piezoelectric elements to thereby cause the head holders to be unloosed. The position adjustment of each magnetic head can be performed by an operator. After the completion of the position adjustment, the piezoelectric elements are connected to the ground, so that they clamp the corresponding head holders which are thus locked to the last adjusted positions, respectively. After all the head holders are locked, the voltage source circuit is disconnected from the head drum. Even under this condition, the hard holders are kept fixed to the position lastly determined by the operator, since the full mechanical clamping of the head holder by the piezoelectric element is carried out under no bias condition.

What is claimed is:

1. A device for adjusting the position of an object, said device comprising:
   mechanical support means for supporting the object and for being movable to adjust the position of the object;
   a piezoelectric element which is used as a locking device for said mechanical support means and which physically deforms or distorts in accordance with a drive voltage applied thereto; and
   voltage source means electrically connected with said piezoelectric element, for supplying said piezoelectric element with a variable DC voltage as the drive voltage, and for controlling said piezoelectric element such that, when the drive voltage is applied thereto, said piezoelectric element unlocks said support means, allowing said support means to move for position adjustment of the object, and, when applied with no drive voltage, presses said support means to inhibit the movement thereof so that said support means places the object in a reference position, said voltage source means comprising,
   a DC voltage source for generating a first DC voltage having a positive polarity of first voltage level, a ground voltage, and a second DC voltage having a negative polarity of second voltage level which is not lower than a voltage for generating a coercive electric field in said piezoelectric element, and
   switch means, connected with said piezoelectric element and said DC voltage source, for performing a switching operation to cause said piezoelectric element to be sequentially applied with the first DC voltage, a ground voltage, the second DC voltage and the ground voltage.

2. The device according to claim 1, wherein said piezoelectric element is arranged such that, when applied with the ground voltage, said piezoelectric element presses and locks said support means to cause the object to be placed in the reference position.

3. The device according to claim 1 further comprising:
   a base body having a straight opening in which said support means is movably provided and space which extends perpendicular to the opening to be coupled therewith at its one end and defines a room in which said piezoelectric element is housed, said opening and said room forming, inside said base body, an opening of substantially T-shaped cross section.

4. The device according to claim 3, wherein said support means comprises a shaft member having its diameter smaller than that of the straight opening of said base body so as to unlock said shaft member in said opening, and wherein said piezoelectric element housed in the room space is positioned in such a manner as to press said shaft member at a side part thereof and fix said shaft member to the last adjusted position under no bias condition.

5. The device according to claim 4, further comprising:
   electrical connector means for detachably connecting said piezoelectric element and said voltage source means with each other, and for, after the position adjustment of the object is completed, disconnecting said voltage source means from said piezoelectric element, whereby said position adjustment device is separated from said voltage source means.

6. The device according to claim 5, wherein said mechanical support means comprises a metal rod which moves to adjust the position of a semiconductor wafer onto which an image of pattern is to be transferred with respect to a reference surface.

7. The device according to claim 5, wherein said mechanical support means comprises a holder which supports one of optical elements constituting a photocoupling device for signal transmission and which moves to cause said optical elements to be aligned with each other along an optical path.

* * * * *